United States Patent
Bürkert et al.

(10) Patent No.: US 12,388,333 B2
(45) Date of Patent: Aug. 12, 2025

(54) MODULAR INTERFACE CONCEPT FOR AN ELECTRIC DRIVE

(71) Applicant: ebm-papst Mulfingen GmbH & Co. KG, Mulfingen (DE)

(72) Inventors: Martin Bürkert, Dörzbach-Hohebach (DE); Günter Haas, Mulfingen (DE); Thomas Rupp, Assamstadt (DE); Daniel König, Gerabronn (DE); Andreas Bader, Braunsbach (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 352 days.

(21) Appl. No.: 17/880,887

(22) Filed: Aug. 4, 2022

(65) Prior Publication Data
US 2023/0044384 A1    Feb. 9, 2023

(30) Foreign Application Priority Data
Aug. 9, 2021    (DE) .................. 10 2021 120 679.0

(51) Int. Cl.
*H02K 11/33*    (2016.01)
*H02K 5/22*    (2006.01)
(Continued)

(52) U.S. Cl.
CPC ............. *H02K 11/33* (2016.01); *H02K 5/225* (2013.01); *H05K 7/14* (2013.01); *H05K 7/14324* (2022.08);
(Continued)

(58) Field of Classification Search
CPC .... H05K 7/14324; H05K 7/026; H05K 7/023; H05K 5/0065; H02K 2211/03; H02K 5/225
See application file for complete search history.

(56) References Cited

U.S. PATENT DOCUMENTS

2009/0079281 A1    3/2009    Best et al.
2012/0286605 A1*   11/2012   Miyachi ................ H02K 5/225
                                                               310/71
(Continued)

FOREIGN PATENT DOCUMENTS

DE    102005037488 B4    12/2007
DE    102015119002 A1    5/2017
(Continued)

OTHER PUBLICATIONS

DE 102019005171 A1 translation (Year: 2021).*
(Continued)

*Primary Examiner* — Oluseye Iwarere
*Assistant Examiner* — Daniel K Schlak
(74) *Attorney, Agent, or Firm* — Harness, Dickey & Pierce, P.L.C.

(57) ABSTRACT

A modular control unit (100) is adaptable, in terms of interface functions, for an electric motor selected from a predetermined number i of electric motors, in particular electric motors of the same power class. The control unit (100) has at least two printed circuit boards (L1, L2), selected from a set of N different printed circuit boards (L1, L2, . . . , LN). Interface functions, electrical components, electronic components or control units for the operation of the electric motor are located on the printed circuit boards.

10 Claims, 3 Drawing Sheets

(51) Int. Cl.
*H05K 5/00* (2025.01)
*H05K 7/02* (2006.01)
*H05K 7/14* (2006.01)

(52) U.S. Cl.
CPC ....... *H05K 7/1435* (2013.01); *H02K 2211/03* (2013.01); *H05K 5/0065* (2013.01); *H05K 7/023* (2013.01); *H05K 7/026* (2013.01)

(56) References Cited

U.S. PATENT DOCUMENTS

| | | | | |
|---|---|---|---|---|
| 2014/0126154 | A1* | 5/2014 | Higuchi | B60L 50/51 361/714 |
| 2017/0135238 | A1* | 5/2017 | Sturm | H05K 5/0017 |
| 2017/0354047 | A1 | 12/2017 | Okura et al. | |
| 2019/0353510 | A1* | 11/2019 | Derschmidt | G01F 15/14 |
| 2021/0195771 | A1* | 6/2021 | Wunderlich | H05K 7/1427 |
| 2023/0014942 | A1* | 1/2023 | Burgermeister | H05K 5/061 |
| 2023/0040396 | A1* | 2/2023 | Sturm | H01R 13/6215 |
| 2024/0120812 | A1* | 4/2024 | Kuo | H02K 5/225 |
| 2025/0079922 | A1* | 3/2025 | Lee | H02K 1/2795 |

FOREIGN PATENT DOCUMENTS

| | | | |
|---|---|---|---|
| DE | 102017217418 A1 | 4/2019 | |
| DE | 102019005171 A1 * | 1/2021 | ............. H02K 1/187 |
| EP | 1237260 A2 | 9/2002 | |
| EP | 2043234 A1 | 4/2009 | |
| EP | 2226922 A1 * | 9/2010 | ............. H02K 11/33 |
| EP | 3166214 A1 | 5/2017 | |
| WO | WO-2011063885 A1 * | 6/2011 | ........... H05K 7/1432 |
| WO | WO-2015181168 A1 * | 12/2015 | ........... H05K 7/1432 |

OTHER PUBLICATIONS

EP 2226922 A1 translation (Year: 2010).*
WO 2015181168 A1 translation (Year: 2015).*
WO 201163885 A1 translation (Year: 2011).*

* cited by examiner

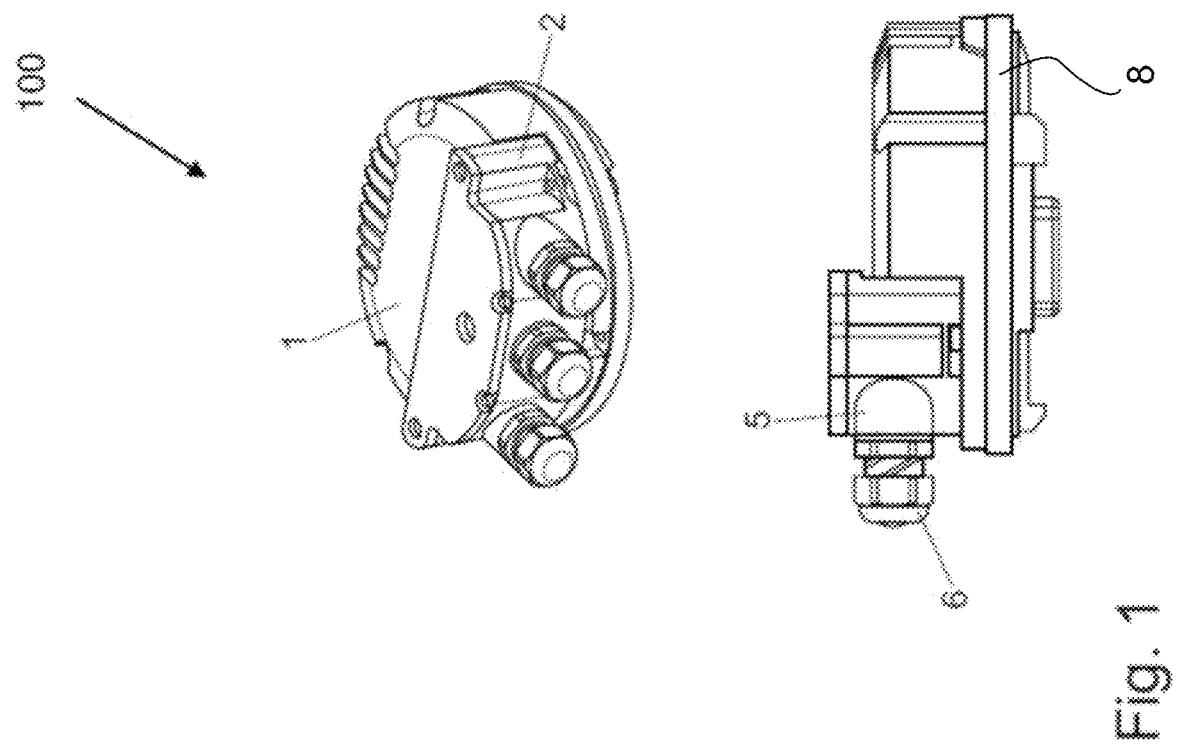
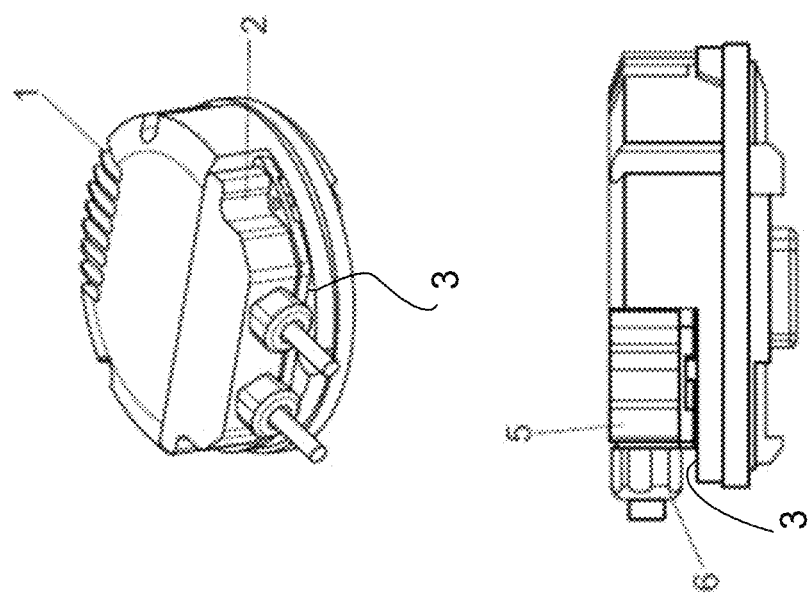
Fig. 1

MODULAR INTERFACE CONCEPT FOR AN ELECTRIC DRIVE

CROSS-REFERENCE TO RELATED APPLICATION

This application claims the benefit and priority of German Application No. 10 2021 120 679.0, filed Aug. 9, 2021. The entire disclosure of the above application is incorporated herein by reference.

FIELD

The present disclosure relates to a modular interface concept for an electric drive, in particular for an electric motor.

BACKGROUND

Nowadays, electric drive technology is prevalent in various areas such as household, commercial and above all in the many areas of industrial production. Here, in particular, their importance increases with the increasing degree of automation in production. The core of the electric industrial drive is, on the one hand, the electric motor as an energy converter between the electric mains and the working machine that requires mechanical energy and, on the other hand, the motor control. The power electronics are one of the three central components of every electric drive. Their task is the control of the electrical machine, the communication with the control and the diagnosis of the drive.

The term "power electronics" means everything that has to do with control, conversion or switching of electrical energy with electronic components. This already starts at a few 100 mA and a few volts, but goes up to several 100 kV and several 1000 A. With lower voltages and currents, the challenge is not in the absolute values themselves, but in the conversion with a particularly high degree of efficiency and with the lowest possible EMC emissions.

Power electronics or power electronic systems always include at least one control or regulation part and the power unit itself and, if necessary, interfaces for connection and communication with other electronic components. Such a power unit—often referred to directly as "power electronics"—consists in turn of several components that must always be matched to each other and the application.

Due to the variety of applications and the specific requirements in each case, the required interfaces for a specific electric motor or a specific electric drive are implemented on a single power electronics system. This means that the power electronics has all the required interfaces in the known applications. In this respect, there is also a large variety of power electronics, even in the same power class.

However, in addition to reducing the number of variants, it is desirable to retain full functionality for the application and in particular to achieve flexibility in the design of the power electronics for a large number of motors and cable classes.

SUMMARY

This section provides a general summary of the disclosure, and is not a comprehensive disclosure of its full scope or all of its features.

The object of the disclosure is therefore to overcome the aforementioned disadvantages in the prior art and to provide an improved, cost-effectively producible concept for motor controls and their power electronics.

A modular control unit is specifically adaptable, in terms of interface functions, for an electric motor selected from a predetermined set of electric motors, in particular of electric motors of the same power class. The control unit includes at least two printed circuit boards (L1, L2), selected from a set of N different printed circuit boards (L1, L2, ..., LN), where interface functions, electrical components, electronic components or control units for the operation of the electric motor are located. The printed circuit board (L1) is a basic printed circuit board equipped with power electronics (LE) for the electric motors. It is accommodated in a first housing of the control unit. Further interface functions, in particular of the power electronics (LE), are provided separately from the power electronics (LE) of the electric motors on the other printed circuit board (L2). The second printed circuit board (L2) includes a housing separate from the first housing. Also, the first housing has a housing wall, enclosing the first circuit board, that mounts the second housing outside the first housing.

According to the disclosure, a modular control unit is specifically adaptable with regard to interface functions, namely for an electric motor selected from a predetermined number i of electric motors, in particular electric motors of the same power class (in particular across sizes and powers). The control unit has at least two printed circuit boards, selected from a set of N different printed circuit boards L1, L2, ..., LN. Interface functions, electrical components, electronic components or control units for the operation of the electric motor are located on the printed circuit boards. A printed circuit board is provided as a basic printed circuit board with power electronics for the electric motors. It is housed in a first housing of the control unit. Further interface functions, in particular of the power electronics, are provided on the other printed circuit board separately from the power electronics of the electric motor. This second printed circuit board is provided in a second housing separate from the first housing. The first housing has a housing wall, enclosing the first printed circuit board, where the second housing is mounted outside of the first housing.

It is also advantageous if the second housing is a terminal box and the second printed circuit board is surrounded by its peripherally closed wall. Thus, the supplementary printed circuit board can be accommodated separately in a terminal box.

Also advantageous is an embodiment where the second housing is superimposed or saddled on a housing portion on an external and stepped recess of the first housing. Thus, the shape of the first housing is supplemented, in particular, in the form that the shape of the two housings are each formed as a partial segment of a substantially cylindrical body. When they are assembled together they essentially complement each other to a common cylinder body or together define a corresponding cylindrical envelope.

In a further preferred embodiment of the disclosure, the second housing has cable entries with integral cable glands, in order to make the electrical connections.

Another advantage is the modular separation of the complementary housing. This is due to the fact that both housings each have their own sealing level or sealing function separate from one another.

As already explained above, a control can be put together modularly for a specific electric motor from a set of printed circuit boards and at the same time, sealing, assembly and electrical functions can be cleverly, easily and inexpensively combined. The interface functions, electrical components, electronic components or control units for the operation of an electric motor are located on a provided set of printed circuit boards. In particular, at least one of the printed circuit boards is equipped with power electronics for the electric motors and some or more of the interface functions. The original interface functions of the power electronics are provided or arranged separately from the electric motor power electronics on one or more of the other printed circuit boards.

The number N of printed circuit boards and the number i of electric motors, as well as other quantities or subsets mentioned, are of course understood to be integers, namely a positive number selected from the group of natural numbers.

To distinguish it from the other supplementary printed circuit boards, the power unit has the following essential components:
1. Power semiconductors (e.g. FET, MOSFET Overview, IGBT, TRIAC);
2. DC link capacitance;
3. Low-inductance structure between intermediate circuit capacitor and power semiconductors;
4. Control circuit=driver;
5. Power supply for the driver; and
6. Monitoring and shutdown device.

These components can also be combined in assemblies.

The solution according to the present disclosure represents a particularly clever separation of the functional units of a motor control. As a result, the variance in the number of motor controls can be significantly reduced without basic functions missing. On the other hand, by separating certain interface functions of the power electronics on one or more other (separate and independent) printed circuit boards through clever combination, basic solutions, improved solutions and premium solutions can be provided to the user without the power electronics having to be modified in each case.

In a further preferred embodiment of the disclosure, two or more printed circuit boards differ in their topology only by further implemented function modules and/or further components. This specific modular structure is based, so to speak, on the implementation of the previously mentioned stages. Thus, a basic solution and various additional improved solutions and premium solutions can always be implemented for the user with a single power electronics system.

It is also advantageous if several interface functions are combined to form interface function groups. These interface function groups are integrated on at least two or more of the printed circuit boards.

An embodiment is particularly advantageous where at least one of the printed circuit boards (basic printed circuit board) contains the basic functional components required to control the selected motor.

It is also advantageous if at least one of the additional printed circuit boards (supplementary printed circuit board) is designed with additional functional components to supplement the function of the printed circuit board with the basic functional components.

In another preferred embodiment of the disclosure, the printed circuit board, with the basic functions for operating the electric motor, has at least one interface for customer-specific functions.

It is also advantageous if there is an interface on the basic printed circuit board for connection to the supplementary printed circuit board and, in particular, an interface for supplying voltage to the respective supplementary printed circuit board.

Another aspect of the present disclosure comprises the set and a method for assembling a motor control for a motor of a specific power class from the set of printed circuit boards. Depending on the functions to be implemented, at least the printed circuit board with the electric motor power electronics and at least one or more of the other printed circuit boards are selected from the set. These are electrically connected to one another via their interfaces. At least one printed circuit board, specifically selected with the interface functions of the power electronics, is arranged thereon separately from the printed circuit board with the power electronics.

A further aspect of the present disclosure, in addition to the set of printed circuit boards, also relates to an electric motor with a motor control, assembled from at least a first printed circuit board, with power electronics, and an additional printed circuit board. Each is selected from the set of printed circuit boards.

In principle, all features disclosed can be combined as desired, provided this is technically possible and reasonable.

Further areas of applicability will become apparent from the description provided herein. The description and specific examples in this summary are intended for purposes of illustration only and are not intended to limit the scope of the present disclosure.

DRAWINGS

Other advantageous developments of the disclosure are illustrated in the dependent claims or are described in more detail below together with the description of the preferred embodiment of the disclosure with reference to the figures.

FIG. 1 is perspective views of two exemplary representations of a modular control unit;

DETAILED DESCRIPTION

The disclosure is explained in more detail below using a purely exemplary embodiment with reference to FIGS. 1 to 3. The same reference symbols in the figure denote structurally and/or functionally identical or similar parts.

Figure 2:
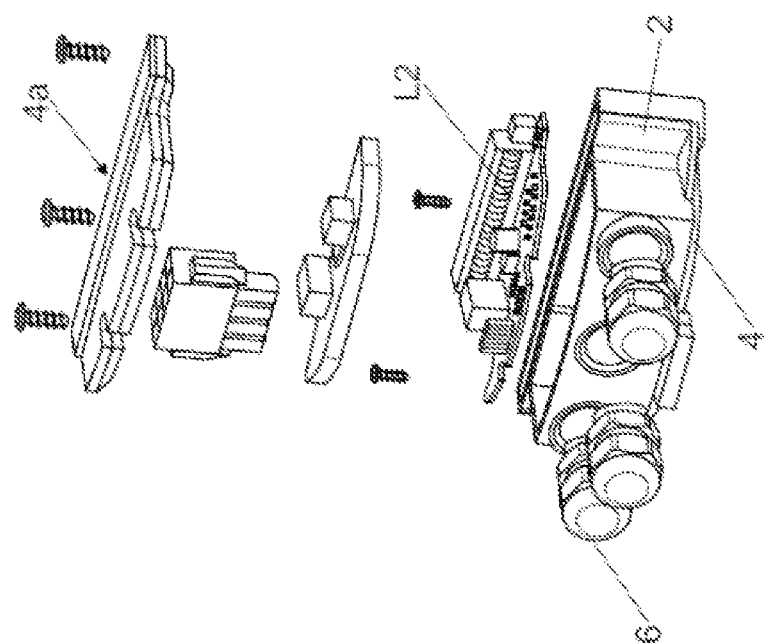
FIG. 2 is an exploded perspective view of a representation of the separated control unit in its individual assemblies and FIG. 3 is a schematic view of an example combination of a basic printed circuit board and a supplementary printed circuit board.

FIGS. 1 and 2 show two exemplary representations of a modular control unit 100.

The modular control unit 100 has a first basic housing 1 and a separate housing 2. In the first housing 1 of the control unit 100, the power electronics L1 is housed, while in the terminal box 2, the other printed circuit board L2 is provided separately from the power electronics L1. The terminal box 2 sits on the housing wall 3 enclosing the first printed circuit board L1 and is mounted on the housing 1 and in particular outside of the first housing 1.

The second printed circuit board L2 is surrounded, in the terminal box, by its peripherally closed wall 4, with a detachable cover 4a forming part of the wall 4. The basic housing 1 has a pot-like cover 7 and a basic plate 8. The second housing 2 rests on a housing portion at an external and stepped recess of the first housing 1 and thereby complements the shape of the first housing 1.

The terminal box 2 has the cable entries 5 with cable glands 6.

Figure 3:
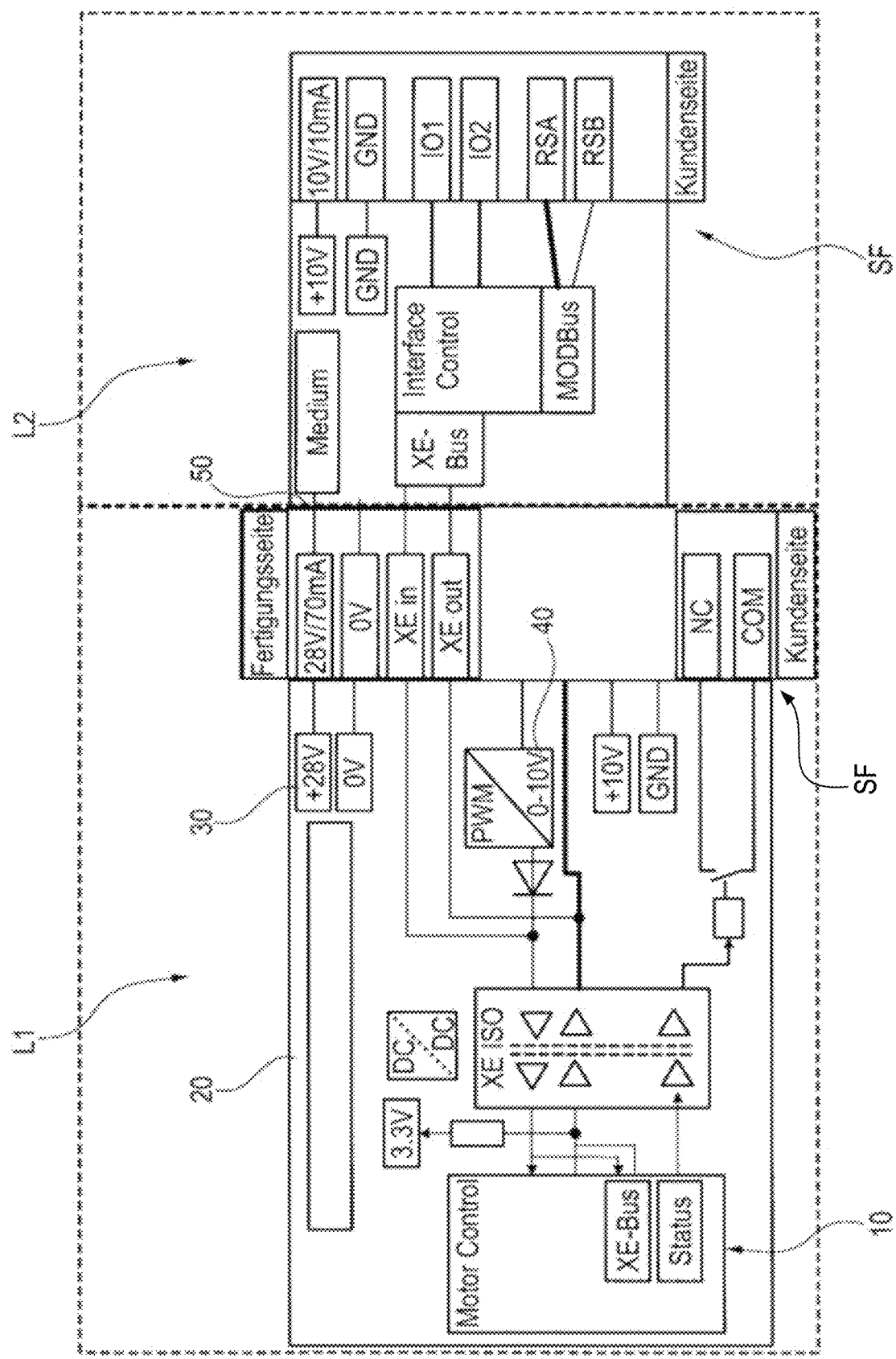

FIG. 3 shows a first functional embodiment, which is merely an example, namely a set of two printed circuit boards, namely a first printed circuit board L1 and a supplementary printed circuit board L2, each with interface functions SF.

Locked on the printed circuit board L1 next to the motor control 10 are a DC/DC converter 20, a power supply 30, a PWM module 40, as well as various other unspecified interfaces and interface functions SF, and interface functions of the customer interface.

The MOD bus, the controller and connections 50 for power supply from the first printed circuit board L1, and other interface functions SF are located on the printed circuit board L2.

Thus, FIG. 1 shows part of a set of at least two printed circuit boards L1, L2 where interface functions, electrical components, electronic components or control units for the operation of an electric motor are located, selected from a predetermined number i of electric motors, especially electric motors of the same power class. This combination of the two selected printed circuit boards represents basic controls with different functions for controlling the respective electric motor, for example, wherein, for example, the printed circuit board L2 can be replaced by an extended, different printed circuit board in order to provide additional functions for the same motor or a motor of the same power class. The printed circuit board L1 includes power electronics LE for the electric motors that can be equipped with it, with some of the interface functions of the power electronics LE however installed separately from the power electronics LE on the second printed circuit board L2.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A modular control unit is specifically adaptable in terms of interface functions for an electric motor selected from a predetermined set of electric motors, in particular of electric motors of the same power class, the control unit comprising:
   at least two printed circuit boards, including a first printed circuit board and at least one second printed circuit board (L1, L2), selected from a set of N different printed circuit boards (L1, L2, . . . , LN) where interface functions, electrical components, electronic components or control units for the operation of the electric motor are located;
   the first printed circuit board (L1) is a basic printed circuit board equipped with power electronics (LE) for the electric motors and is accommodated in a first housing of the control unit;
   further interface functions of the power electronics (LE) are provided separately from the power electronics (LE) of the electric motors on the at least one second printed circuit board (L2) and the at least one second printed circuit board (L2) includes a second housing separate from the first housing and the first housing has a housing wall enclosing the first printed circuit board, on which the second housing is mounted outside of the first housing, and the second housing rests on a housing portion at an external and stepped recess positioned outside of the first housing and thereby complements the shape of the first housing.

2. The modular control unit of claim 1, wherein the second housing is a terminal box and the at least one second printed circuit board (L2) is surrounded by a peripherally closed wall.

3. The modular control unit of claim 1, wherein the second housing has integral cable entries with cable glands and/or the second housing has an integral plug-in connection/connector.

4. The modular control unit of claim 1, wherein both housings are designed as standalone housings formed separately from each other, each having its own sealing level.

5. The modular control unit of claim 1, wherein the shape of both housings is formed in each case as a sub-segment of a substantially cylindrical body and complement each other to essentially form a cylinder body in the assembled state.

6. The modular control unit of claim 1, wherein a plurality of interface functions are combined into interface function groups and such interface function groups are integrated on at least two or more of the printed circuit boards (L1, L2, . . . , LN).

7. The modular control unit of claim 1, wherein at least one of the at least one second printed circuit boards (L2, L3, . . . , LN) (supplementary printed circuit board) is provided with further functional components to supplement the function of the at least one second printed circuit board having basic functional components.

8. The modular control unit of claim 1, wherein the first printed circuit board having basic functions for operating the electric motor has at least one interface for customer-specific functions.

9. The modular control unit of claim 1, wherein there is an interface on the first printed circuit board (L1) for connection to the at least one second printed circuit board (L2, L3, . . . , LN) and an interface for a power supply of the at least one second printed circuit board (L2, L3, . . . , LN).

10. A method for assembling a modular control unit of claim 1 for a motor of a specific power class, wherein,
   at least one or more of the second printed circuit boards (L2, L3, . . . , LN) are selected and are electrically connected to the first printed circuit board, via their interfaces, with at least one second printed circuit board (L2, L3, . . . , LN) being selected, where interface functions of the power electronics are arranged separate from the first printed circuit board (L1) with the power electronics and this selected second printed circuit board is preferably installed in a terminal box of the control unit.

* * * * *